United States Patent [19]
Chenevert et al.

[11] Patent Number: 6,167,293
[45] Date of Patent: Dec. 26, 2000

[54] METHOD FOR PERFORMING MAGNETIC RESONANCE ANGIOGRAPHY USING A CONTRAST AGENT

[75] Inventors: Thomas Leonard Chenevert, Ann Arbor, Mich.; Thomas Kwok-Fah Foo, Waukesha, Wis.; Martin R. Prince, Ann Arbor, Mich.

[73] Assignees: General Electric Company, Waukesha, Wis.; The Regents of the University of Michigan, Ann Arbor, Mich.

[21] Appl. No.: 08/635,078

[22] Filed: Apr. 19, 1996

[51] Int. Cl.$^7$ .................................................. A61B 5/055
[52] U.S. Cl. ......................... 600/420; 324/306; 324/309
[58] Field of Search ............................ 128/653.4, 653.3, 128/653.2, 716, 721; 324/306, 309; 424/9.3; 600/410, 419, 420, 529, 534

[56] References Cited

U.S. PATENT DOCUMENTS

| | | | |
|---|---|---|---|
| 5,222,500 | 6/1993 | Sugimoto | 128/653.2 |
| 5,287,273 | 2/1994 | Kupfer et al. | |
| 5,301,672 | 4/1994 | Kalender | 128/654 |
| 5,363,844 | 11/1994 | Riederer et al. | 128/653.2 |
| 5,417,213 | 5/1995 | Prince | 128/653.3 |
| 5,429,134 | 7/1995 | Foo | 128/653.2 |
| 5,509,412 | 4/1996 | Bahn | 128/653.2 |
| 5,515,863 | 5/1996 | Damadian | 128/653.4 |
| 5,553,619 | 9/1996 | Prince | 128/653.4 |
| 5,579,767 | 12/1996 | Prince | 128/653.4 |
| 5,590,654 | 1/1997 | Prince | 128/653.4 |

FOREIGN PATENT DOCUMENTS 543 468 A1   11/1992   European Pat. Off. ................... 33/56

OTHER PUBLICATIONS

Bolus–Triggered CT Angiography–First Clinical Results, Scientific Session 30: Vascular–Heart/Great Vessels, Mar. 1995, supplement to AJR, Kopka, et al.

PCT International Search Report, Appln. No. PCT/US/97/06467.

Dynamic Three–dimensionial Imaging with Partial K–Space Sampling: Initial Application for Gadolinium–enhanced Rate Characterization of Breast Lesions, Radiology 1995, vol. 196, No. 1, pp. 135–142, Chenevert, et al.

A Rapid Interleaved Method for Measuring Signal Intensity Curves in Both Blood and Tissue during Contrast Agent Administration, MRM 30:744–749 (1993), Taylor, et al.

Automated Detection of Bolus Arrival and Initiation of Data Acquisition in Fast, Three–dimensional, Gadolinium–enhanced MR Angiography, Radiology 1997; 203:275–280.

A Simple MR–Compatible Infusion Pump, MRI, vol. 14, No. 1, pp. 121–128, 1996, Prince, et al.

Body MR Angiography With Gadolinium Contrast Agents, MRI Clinics of North America, vol. 4, No. 1, pp. 11–24, Feb. 1996, M.R. Prince.

Gadolinium–enhanced Magnetic Resonance Angiography of Abdominal Aortic Aneurysms, Jour. of Vascular Surgery, vol. 21, No. 4, pp. 656–669, Prince et al.

Breath–hold Gadolinium–enhanced MR Angiography of the Abdominal Aorta and Its Major Branches, Radiology, vol. 197, No. 3, pp. 785–792, Dec. 1995, Prince, et al.

Dynamic Gadolinium–enhanced Three–dimensional Abdominal MR Arteriography, Radiology JMRI, vol. 3, No. 6, pp. 877–881, Nov./Dec. 1993, Prince, et al.

Gadolinium–enhanced MR Aortography, Radiology, vol. 191, No. 1, 1994; pp. 155–164, M.R. Prince.

*Primary Examiner*—Brian L. Casler
*Attorney, Agent, or Firm*—Quarles & Brady LLP

[57] ABSTRACT

A 3DFT MRA dynamic study is performed using a contrast agent to enhance image contrast. A monitor pulse sequence is performed at a high temporal rate to monitor the magnitude of the NMR signal produced in a monitor region after the contrast agent is injected into the patient. When the monitor signal reaches a threshold value, the patient is signaled and the 3DFT image data set is acquired.

24 Claims, 4 Drawing Sheets

METHOD FOR PERFORMING MAGNETIC RESONANCE ANGIOGRAPHY USING A CONTRAST AGENT

This invention was made with government support under Grant No. HL 46384 awarded by the National Heart Lung and Blood Institute. The government has certain rights in the invention.

BACKGROUND OF THE INVENTION

The field of the invention is magnetic resonance angiography ("MRA"), and particularly, studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged. There is also the issue of increased nephra-toxicity and allergic reactions to iodinated contrast agents used in conventional x-ray angiography.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Moreover, high temporal resolution x-ray angiography only provides a projection view of the body in which overlapping structures are superimposed.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. Flowing blood, which is moving through the excited section, is continually refreshed by spins experiencing fewer excitation pulses and is, therefore, less saturated. The result is the desired image contrast between the high-signal blood and the low-signal stationary tissues.

MRA methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase or complex difference between the pair of velocity-encoded images.

Despite the tremendous strides made in recent years, at many clinical sites MRA is still considered a research tool and is not routinely used in clinical practice. More widespread application of either TOF or PC techniques is hampered by the presence of a variety of deleterious image artifacts, which can mask and, in some cases, even mimic pathology. These artifacts generally result in a lower specificity, as well as compromised sensitivity.

To enhance the diagnostic capability of MRA a contrast agent such as gadolinium can be injected into the patient prior to the MRA scan. Unlike x-ray angiographic methods in which many images are produced during the critical time period during which the bolus of contrast agent is flowing through the vasculature of interest, many seconds are required to acquire data for an MRA image. As described in U.S. Pat. No. 5,417,213, entitled "Magnetic Resonance Arteriography With Dynamic Intravenous Contrast Agents," the trick in MRA is to acquire the central k-space views at the moment the bolus of contrast agent is flowing through the vasculature of interest. This is not easy to achieve as part of a routine clinical procedure. The mean transit time varies from patient-to-patient, and it is a function of the method used to deliver the bolus, the patient's heart rate, blood pressure and average blood flow velocities.

SUMMARY OF THE INVENTION

The present invention is a method for performing a dynamic study in which a contrast agent is employed to enhance the image contrast. More specifically, the method includes: injecting a contrast agent into the patient; acquiring a monitor signal produced by spins in a monitor region; and automatically initiating the acquisition of NMR image data from an image region of interest when the monitor signal reaches a preselected condition. The monitor region and image region of interest are not necessarily the same, and may not even overlap depending on the patient vascular anatomy. The monitor signal is produced by repeatedly executing a monitor pulse sequence to acquire NMR signals from the monitor region at a relatively high temporal rate.

A general object of the invention is to reliably improve the quality of NMR images using contrast agents. The monitor pulse sequence is employed to monitor the effect of the contrast agent on the spins near or within the region of interest to be imaged. When the monitor signal increases beyond a specified threshold value, the contrast bolus has reached the region of interest and an optimal image can begin to be acquired by performing the desired imaging pulse sequence.

Another object of the invention is to alert the patient at the optimal moment to begin breath-holding. The monitor signal is used to detect a point in the dynamic study during which the leading edge of the contrast bolus has arrived in the region of interest. The patient is signaled at this point to begin a breath-hold. Consequently, when the image scan is subsequently started as the contrast bolus peak is detected, the patient is motionless.

DESCRIPTION OF THE PREFERRED EMBODIMENT

Figure 1:
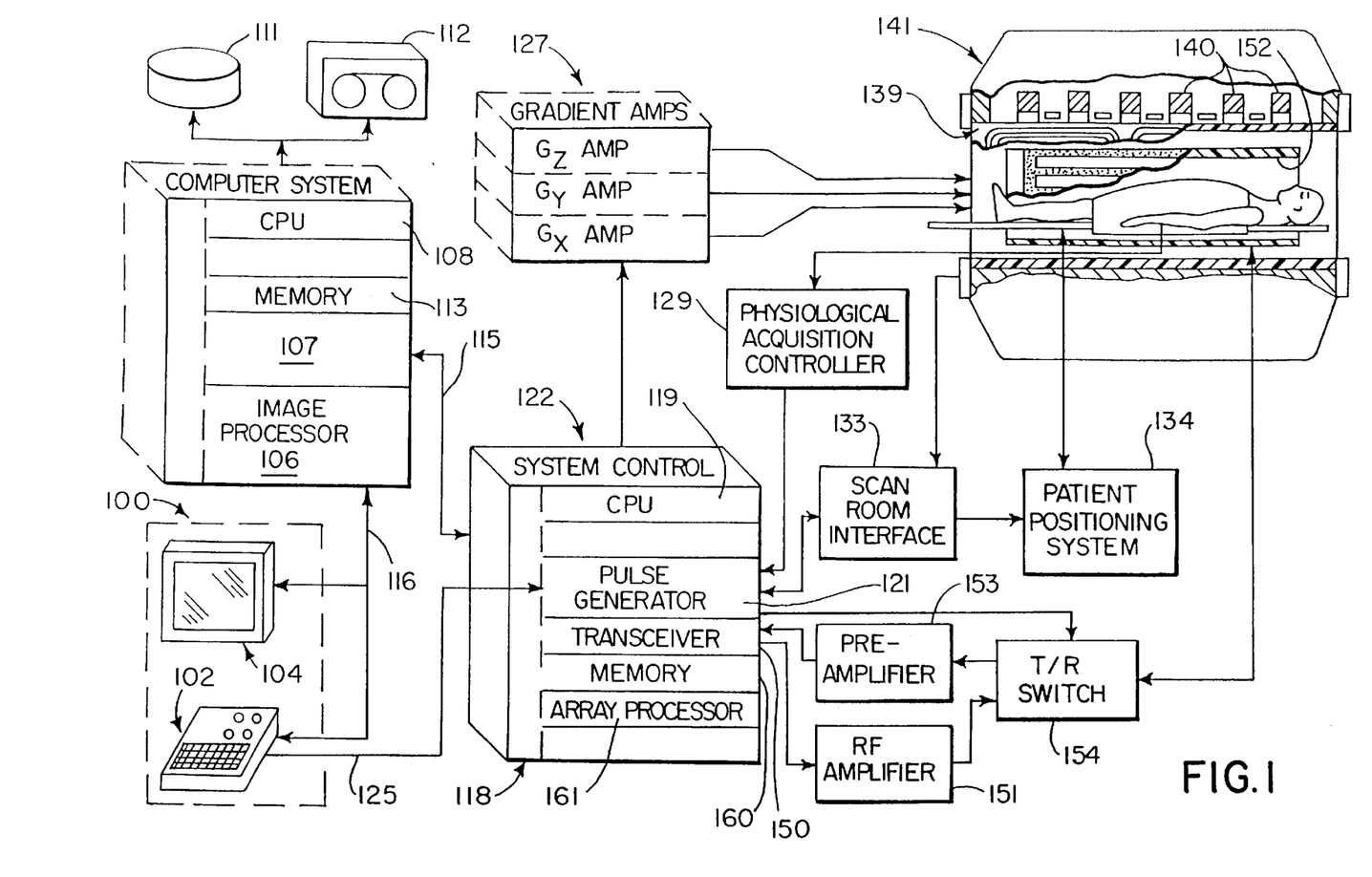
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
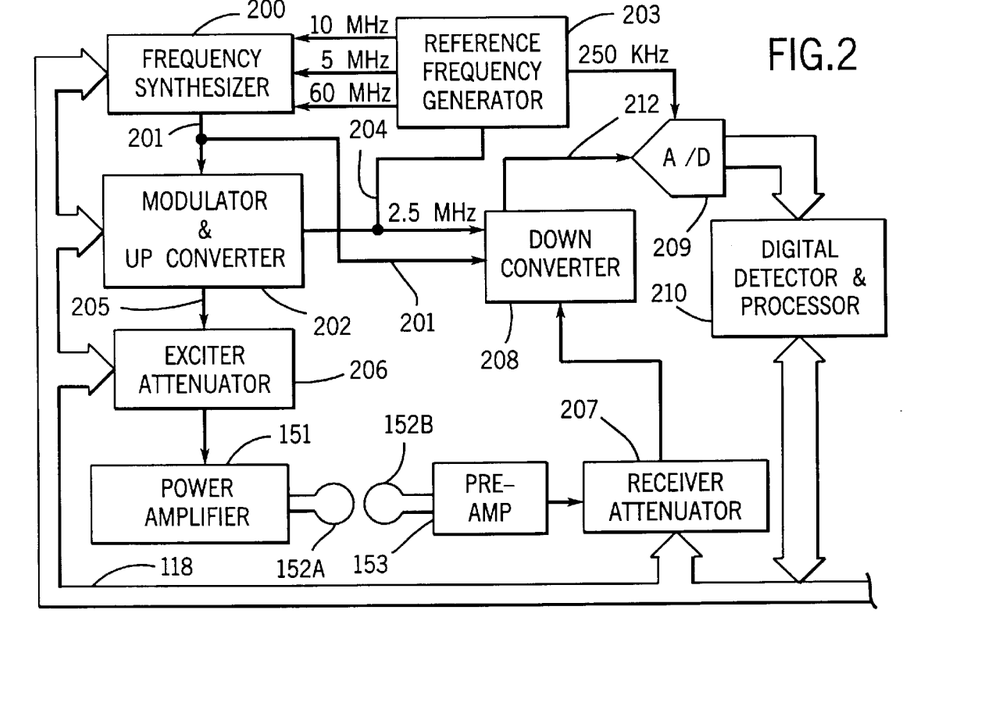
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118.

The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 Mhz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 Mhz reference signal as well as the 250 Khz sampling signal and the 5, 10 and 60 Mhz reference signals are produced by a reference frequency generator 203 from a common 20 Mhz master clock signal. For a more detailed description of the receiver, reference is made to U.S. Pat. No. 4,992,736 which is incorporated herein by reference.

Figure 3:
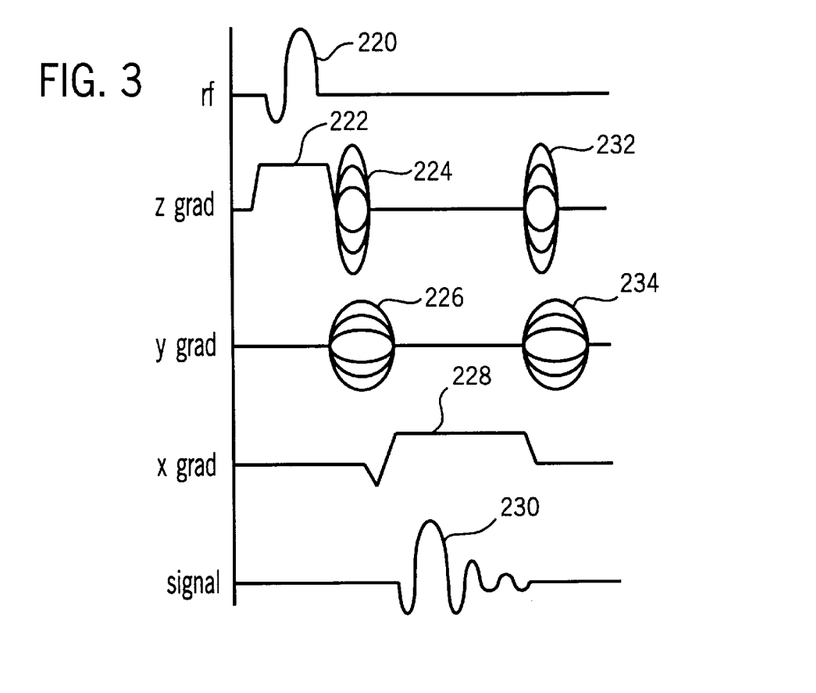
FIG. 3 is a graphic representation of the imaging pulse sequence employed in the preferred embodiment of the invention.

Although the present invention can be used with a number of different pulse sequences, the preferred embodiment of the invention employs a fast 3D rf phase spoiled gradient recalled echo pulse sequence depicted in FIG. 3 is employed to acquire the MRA image data. The pulse sequence "3dfgre" available on the General Electric 1.5 Tesla MR scanner sold under the trademark "SIGNA" with revision level 5.5 system software is used. It was modified to collect data from multiple volumes so that the k-space sampling patterns taught by the present invention can be practiced.

Referring particularly to FIG. 3, an RF excitation pulse 220 having a flip angle of from 40° to 60° is produced in the presence of a slab select gradient pulse 222 to produce transverse magnetization in the 3D volume of interest as taught in U.S. Pat. No. 4,431,968. This is followed by a slice encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365. As is well known in the art, the pulse sequence is repeated and the respective slice and phase encoding gradient pulses 224 and 226 are stepped through a series of values to sample the 3D k-space.

A centric view acquisition order is employed to ensure that the low spatial frequency data is acquired first. A centric phase encoding acquisition order in Y, where the low spatial frequencies in Y are acquired first is preferred. For each $k_y$ value, all $k_z$ data is acquired. The inner loop of Nz views may also be centrically acquired, but a sequential acquisition order has been found sufficient. The number of slice encodings $N_z$ and phase encodings $N_y$ will, of course, depend on the particular application, but in an MRA of the aorta, for example, thirty-two slices ($N_z$=32) of 1 to 5 mm thickness are acquired with 128 phase encodings ($N_y$=128). In most applications the bolus of contrast agent will traverse the vasculature of interest for a long enough period to acquire the entire 3D data set. However, if the period is shorter, at least the central k-space views which contribute the most to image contrast are acquired first when the signal is maximum.

If higher resolution images are desired in addition to short image acquisition times, a different acquisition scheme may be used. By acquiring a 75–80% fractional echo in the frequency encoding direction (along the x axis), and a fractional (0.5 NEX) acquisition in the phase encoding direction (along the y axis), spatial resolution can be increased while maintaining short scan time. Image reconstruction is facilitated by zero filling and performing a normal Fast Fourier Transform in the frequency encoding direction and a fractional echo reconstruction in the phase encoding direction as disclosed in Noll DC, Nishmura DG, Macoviski A, "Homodyne Detection in Magnetic Resonance Imaging," *IEEE Trans. Med. Imaging* 1991; 10(2): 154–163. This fractional echo-fractional NEX technique allows the acquisition of a 256×256 image in a time equivalent to a 256×128 scan.

When gadolinium or other MR contrast is injected intravenously, it travels with the venous blood back to the heart, through the lungs, and eventually reaches the aorta and other arteries. When gadolinium reaches the arteries (in what is known as the "arterial phase" of the intravenous injection), it shortens the T1 and T2 relaxation times of the arterial blood according to the following equations $$\frac{1}{T} = \frac{1}{T_{10}} + R_1 c$$

$$\frac{1}{T_2} = \frac{1}{T_{20}} + R_2 c$$

where
  c=the concentration of MR contrast agent
  $R_1$=the $T_1$ relaxivity of the MR contrast agent
  $R_2$=the $T_2$ relaxivity of the MR contrast agent
  $T_{10}$=the $T_1$ of arterial blood without any contrast agent
  $T_{20}$=the $T_2$ of arterial blood without any contrast agent When an MR radio frequency is applied to a volume of tissue within a magnetic field, that volume of tissue will them emit an NMR signal for a brief period of time. This time is characterized by a time constant, T2, known as the spin-spin relaxation time. After each pulse, the tissue requires an amount of time, characterized by the time constant, T1, in order to return to its original state. This time constant, T1, is known as the spin-lattice or longitudinal relaxation time. If a continuous series of pulses are given in rapid succession (i.e., with an interval such that TR<<T1), then the magnitude of the signal emitted by the tissue in response to each pulse will approach a steady state level that is substantially less than the signal emitted in response to the very first pulse. This steady state level of signal is related to many factors including:
  the T1 relaxation time of the tissue
  the interval between pulses (TR)
  the magnitude of the pulse (flip angle "a")
  the echo time (TE) and T2 of the tissues
  the spin density (number of protons available to emit signal)

For a typical gradient-echo pulse sequence the signal (SI) emitted is given by the following formula:

$$SI = N(H) \frac{1 - \exp\left(-\frac{TR}{T1}\right)}{1 - \cos(a) \cdot \exp\left(-\frac{TR}{T1}\right)} \cdot \sin(a) \cdot \exp\left(-\frac{TE}{T2}*\right)$$

When the contrast material arrives in the arteries of interest, it shortens the T1 relaxation time of the arterial blood. This results in an increase in the signal emitted by a continuous series of pulses, as shown in the above equation. This signal increase corresponds with the arrival of gadolinium in the arteries of interest. Detecting this signal increase thus, represents a way of detecting the arrival of gadolinium in the arteries of interest.

In order to make the change in signal associated with the arrival of contrast easy to detect, it is useful if this signal change is large compared to the baseline variation in signal. This can be accomplished by exciting a volume of tissue for which a large fraction is arterial blood. Limiting the volume of excitation to a segment of the aorta, for example, results in a high volume fraction of arterial blood. The volume may extend beyond the entire circumference of that segment of aorta to reduce the effects of inflow of unsaturated spins or the volume may be confined within the aorta to increase the relative fraction of blood signal but at the expense of increased inflow of unsaturated spins.

There are many strategies for limiting the excitation or interrogation to a limited volume of spins. Using orthogonal or spiral gradients, it is possible to selectively excite only a column of tissue (Chenevert T L, Brunberg J A, Pipe J G. Anisotropic diffusion in human white matter: demonstration with MR techniques in vivo. Radiology 1990; 177:401–405. Pauly J, Nishimura D, Macovski A. A k-space analysis of small-tip-angle excitation. Journal of Magnetic Resonance 1989; 81:43–56).

Figure 7:
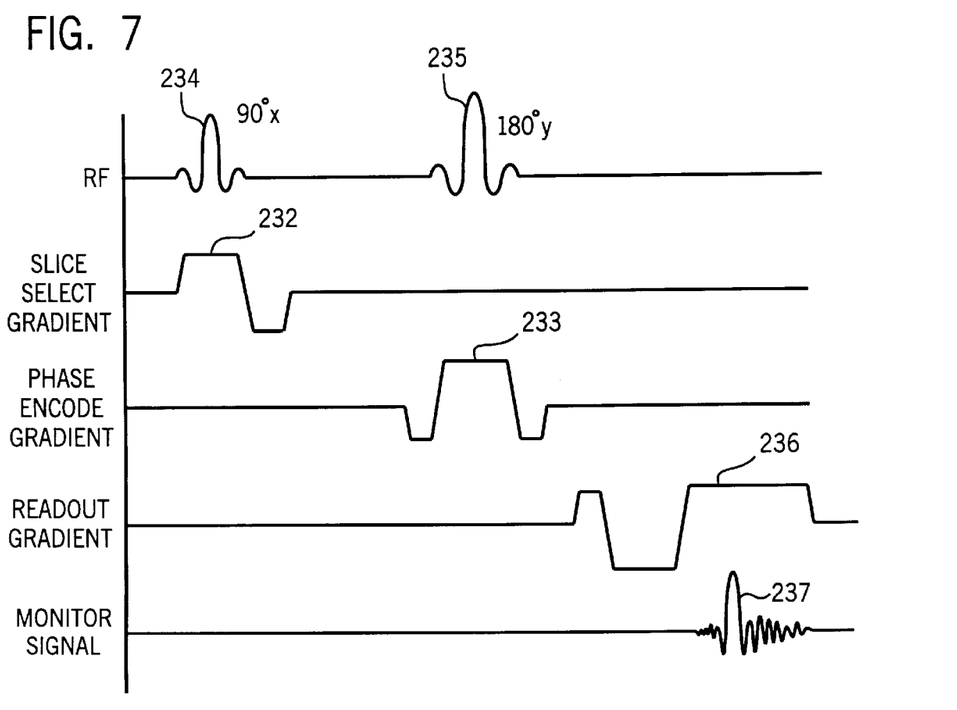
FIG. 7 is a graphic representation of a preferred embodiment of the monitor pulse sequence used to acquire the monitor signal.

In the preferred embodiment a spin echo pulse sequence shown in FIG. 7 is used to acquire monitor signal data from a selected monitor region. The strength and duration of the gradient pulses 232 and 233 determines the extent of the volume of excitation. By applying first a 90 degree pulse 234 followed by a 180 degree refocusing pulse 235 in orthogonal planes, the interrogation is limited to those spins in a column that is exposed to both the 90 and 180 degree pulses. This spin echo sequence also has the advantage of compensating for undesirable field and phase inhomogeneity effects. Note also that the orientation of the monitor column can be easily rotated to match the anatomy of interest. By frequency encoding position information with gradient pulse 236, it is possible to further limit the extent of the zone of monitoring by using the digital receiver bandwidth (in the receiver electronics) to exclude from the monitor signal 237 those frequencies that correspond to areas outside of the monitor region of interest.

If the volume of excitation is fairly large, it is possible to selectively eliminate a substantial portion of the undesirable signal by using a chemically selective, "fat-saturation" prepulse or other techniques to eliminate the signal from fat prior to the 90°–180° pulse sequence. Since fat is often abundant and is the brightest background tissue, this can eliminate a substantial fraction of the undesirable background signal.

Baseline signal variation can be reduced by averaging the signal. A substantial component of the baseline variation is related to respiratory motion. One way to minimize this variation is to synchronize the data averaging to a respiratory trigger. In this way, each block of averaged points corresponds roughly to one respiratory cycle or to a portion of one respiratory cycle. Another way to minimize respiratory motion effects is to confine the monitoring volume to regions that have minimal motion related to respiration.

Inhomogeneity in the magnetic field over the monitoring volume and motion sensitive gradients can result in phase dispersion effects. This may be due to tissue factors, MRI system inhomogeneities, metal in the vicinity, the susceptibility effect of a column of highly concentrated gadolinium or other MR contrast, and flow-related phase shifts. There may also be phase dispersion from the intrinsic differences in Larmor frequency between fat and water protons due to their different gyro magnetic ratio. These phase dispersion effects can reduce the magnitude of the monitor signal increase due to the presence of gadolinium. In extreme situations, it can lead to the paradoxical effect of the signal decreasing following the arrival of gadolinium.

There are several approaches to minimizing these undesirable phase effects. One approach, mentioned above, is to use a spin-echo type of monitoring pulse sequence with a 180° refocusing pulse. This 180° pulse helps to refocus phase dispersion related to static effects. Fat saturation, also mentioned above, can overcome the problem of fat and water being out-of-phase. One problem with fat saturation is that field inhomogeneity may cause the saturating pulse to eliminate water proton signal in some regions of the image making it more difficult to detect the arterial gadolinium if the monitoring volume is large. The problem of fat and water being out-of-phase can also be minimized by using an echo time TE, where fat and water are in-phase. At 1.5 Tesla, an optimal echo time is about 4–4.5 msec to collect signal with fat and water in-phase.

If a gradient is applied during read-out of the monitor NMR signal, then it is useful to monitor the integral of the absolute value of a large portion of the signal. Looking at just the peak echo signal may be more sensitive to error from phase effects as these may cause the peak to shift or increase proportionately less than other parts of the echo. Alternatively, depending upon the geometry of the monitoring volume and the artery being monitored, the change in the peak signal with arrival of gadolinium may be much greater than the change in the integral of the signal. In this instance, monitoring the peak of the echo may be more sensitive than monitoring the integral of the echo. However, large susceptibility shifts in the monitor volume signal may lead to a dispersion of the peak echo signal, especially during the passage of a high susceptibility contrast agent such as gadolinium.

In order to minimize loss of signal related to blood motion while gradients are turned on, it is useful to use a motion compensated gradient wave form. A variety of suitable wave forms are well known to those skilled in the art as described in: Pattany P M, Phillips J J, Chiu L C, Lipcamon J D, Duerk J L, McNally J M, Mohapatra S N, "Motion artifact suppression technique (MAST) for MR imaging,"*Journal of Computer Assisted Tomography* 1987; 11:369–377; and Pipe J G, Chenevert T L, "A progressive gradient moment nulling design technique," *Magnetic Resonance in Medicine* 1991; 175–179. In addition, the dephasing related to motion of blood across gradients may be minimized by using gradients of low strength. The read-out gradient strength, for example, can be minimized by using a large monitoring field-of-view.

Because gadolinium and other MR contrast agents shorten both the T1 and the T2* of blood, undesirable T2* effects must be taken into consideration. When the concentration of gadolinium contrast in the arterial blood is too high, the T2* shortening effect may cause the NMR signal to last for too brief a period to detect. This will then have the paradoxical effect of causing the monitor signal intensity to decrease when the gadolinium arrives. This becomes a problem when the signal gains due to T1 shortening are masked by signal loss due to T2* shortening. In order to avoid the possibility of excessively short arterial blood T2*, the initial part of the intravenous infusion may be performed slowly to avoid excessively high arterial gadolinium concentrations at the leading edge of the contrast bolus.

Figure 6:
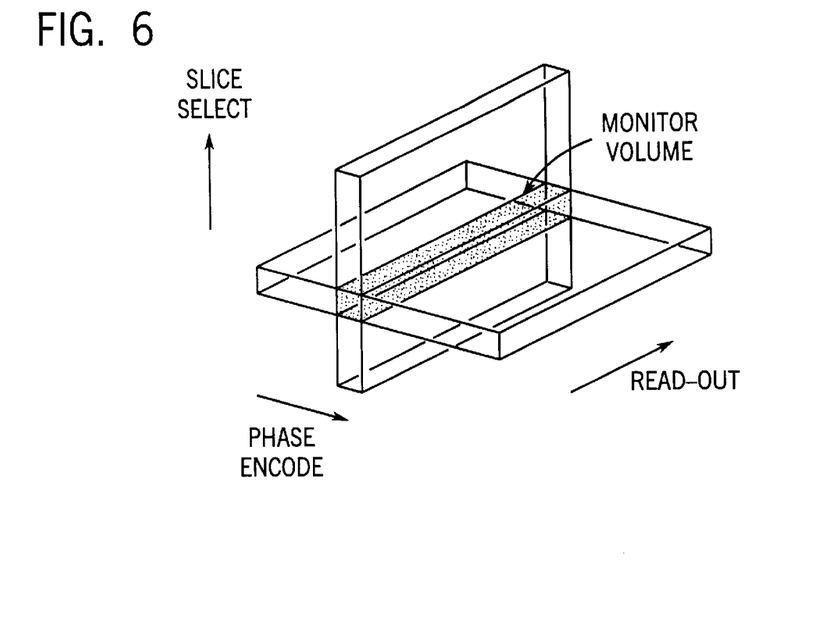
FIG. 6 is a graphic illustration of the monitor volume from which the monitor signal is acquired.

To practice the present invention a monitor pulse sequence is employed to monitor the NMR signal level from the region of interest as the contrast agent is injected. A number of pulse sequences that acquire an NMR signal from the region of interest can be employed, but in the preferred embodiment the monitor sequence of FIG. 7 is used with a TR of 20 ms. The rf pulses 234 and 235 are slice selective and the slice selective gradients 232 and 233 are applied in orthogonal planes to select a volume in the patient as shown in FIG. 6. In order to maximize the signal from the monitor volume, the read-out gradient waveform 236 is flow compensated for the first moment. The monitor segment automatically selects the minimum TE time based on the minimum waveform times. The acquired NMR signal 237 is integrated and the value is stored.

Data from 20 monitor signal acquisitions are averaged to improve the noise statistics and produce a single data point. The temporal resolution of the monitor segment is given by $$\Delta t = mon\_tr \times num\_avgs$$

where mon_tr is the repetition time for the monitor segment and num_avgs is the number of TR segments that are averaged together. For the nominal values of mon_tr=20 ms, and num_avgs=20, the monitor pulse sequence adds a sample to the monitor signal every 400 ms.

During the monitor phase, both the integrated echo signal and the rate of change of this signal with time (slope) are stored in an array. The pulse sequence keeps track of this data and initiates the breath-hold alert and subsequent image data acquisition once the signal exceeds a threshold value as will be described below.

Figure 4:
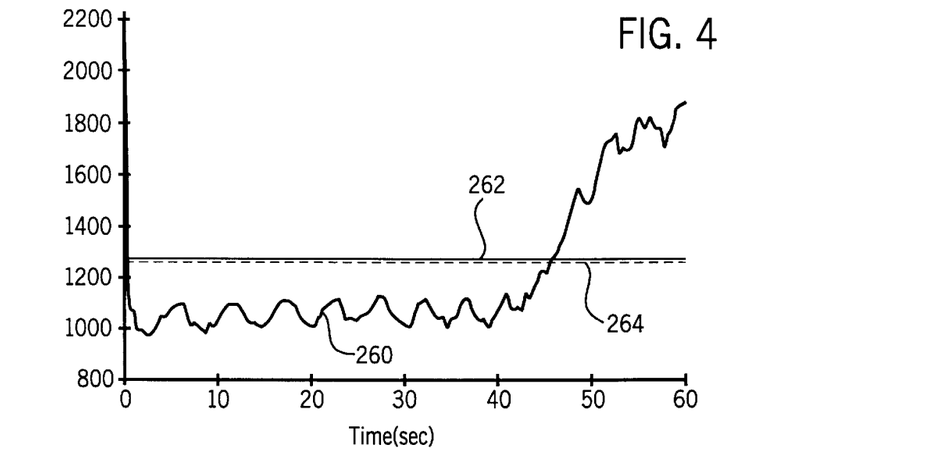
FIG. 4 is a graphic representation of a monitor signal produced during the dynamic study according to the present invention.

An example of a monitor signal 260 is illustrated in FIG. 4. This figure is a plot of the integral of the monitor signal, averaged over num_avg points, detected in the monitor volume as a function of time. The first 5–6 data points (2–3 seconds) are ignored to allow the magnetization in the monitor volume to drop to a dynamic equilibrium state. The next 40–43 data points (16–18 seconds) are used to acquire baseline statistics regarding the signal from the monitor volume. The length of time required for the baseline acquisition is chosen to include at least 3 respiratory cycles. This is because the monitor signal can be modulated by the patient's respiration as shown in FIG. 4. The base line acquisition is used to measure the standard deviation of the monitor signal change due to respiratory motion over several respiratory cycles. This is performed in order to avoid interpreting increases due to respiratory motion as signal increases due to the arrival of the contrast agent bolus.

After the baseline phase, the MR system indicates to the system operator that the contrast agent bolus can now be administered. One embodiment is to hold the system clock to indicate that the sequence is in the baseline acquisition mode. Another embodiment is to use indicator lights to perform the same task.

After administration of the contrast agent, the material begins to circulate through the vascular system in the body. As the leading edge of the contrast bolus enters the monitor volume, the detected signal intensity increases. For an intra-cellular contrast agent such as Gd-DPTA that leaks into the extra-cellular space from the intra-vascular space over time, the signal intensity is expected to steadily rise as the contrast material is also taken up in the muscle and other tissue parenchyma. Hence, a threshold detection technique in this case is preferred. If an intra-vascular contrast agent is used, i.e., one that stays in the vasculature, then the signal intensity curve is expected to increase to a maximum value, and then decline as the concentration of the contrast agent diminishes due to re-circulation and dispersion of the bolus.

As shown in FIG. 4, two thresholds are established in the preferred embodiment, and both thresholds must be exceeded by the monitor signal 260 to trigger the next step in the dynamic study. One threshold requires that the monitor signal 260 exceed five standard deviations from the baseline value indicated by line 262, and a second threshold indicated by line 264 requires that the monitor signal 260 exceed 120% (1.2 times) of its baseline mean value. It is after the signal has exceeded the pre-determined threshold values that the patient is signaled by the MR device to start a breath-hold. Image data acquisition is started immediately hereafter (e.g. 2 to 3 seconds after the trigger point is detected).

It should be apparent that there are many features contained in the monitor signal that may be used singly or in combination to indicate contrast material arrival. These include: signal magnitude increase above thresholds based on measured signal variability and precontrast amplitude; peak then plateau in monitor signal; and detection of an inflection point where monitor signal slope is maximum.

Figure 5:
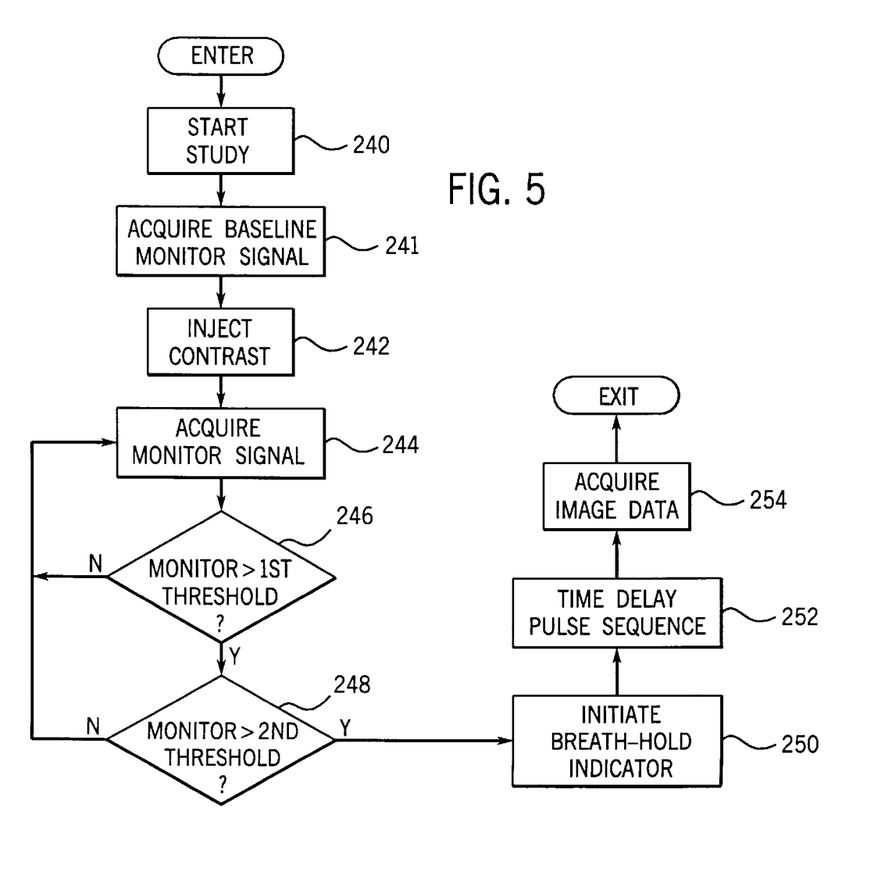
FIG. 5 is a flow chart of a program carried out by the MRI system of FIG. 1 to practice the present invention.

The dynamic study according to the preferred embodiment of the invention is carried out under the direction of a program executed by the system control 122. Referring particularly to FIG. 5, the dynamic study is started at process block 240 by initializing data structures and downloading the monitor pulse sequence to the pulse generator 121. The monitor sequence begins with dummy rf excitations to attain dynamic equilibrium and acquire baseline statistics of the mean and standard deviation of the monitor signal at process block 241. The operator is then signaled through operator console 100 to inject the contrast agent as indicated at process block 242.

A loop is then entered in which the monitor pulse sequence is executed to produce the monitor signal as described above. More specifically, the monitor pulse sequence is performed by the pulse generator 121 as indicated at process block 244, and the monitor signal sample is acquired. The monitor signal is averaged every 20 rf excitations (TR intervals) to update the monitor signal magnitude. The slope of the monitor signal as a function of time is calculated. Both the signal magnitude and the slope are recorded and stored for latter reference. The magnitude signal is first checked to see if it exceeds five standard deviations of the baseline signal as indicated in process block 246. That is, does the monitor signal, $S(t) > \bar{x} + 5\sigma$, where $\bar{x}$ is the mean baseline signal, and $\sigma$ is the standard deviation of the baseline signal? If this first condition is satisfied, the monitor acquisitions continue until the magnitude signal exceeds an absolute level of about 120% of the mean baseline magnitude signal (i.e., the monitor signal $S(t) > 1.2\bar{x}$), as indicated in block 248. If this second condition is satisfied, then a trigger point has been reached.

The pulse sequence then reverts to the imaging pulse sequence that is downloaded to the pulse generator 121 and executed immediately. As the imaging sequence repetition time, TR, is much shorter than that of the monitor sequence, there is a noticeable difference in the noise levels from the different pulsing of the gradient coils. This difference produces a distinct audible signal to the patient signaling him to start a breath-hold, as indicated in process block 250. Two complete slice encode loops (i.e., gradient waveform amplitudes that increment in amplitude with each TR interval) followed by a train of rf pulses with non-varying gradient waveform amplitudes are played out. The patient (and operator) can also be signaled by indicator lights (not shown) that can be switched on.

Following the train of rf pulses with non-varying gradient waveform amplitudes, the slice encode loops are restarted prior to image data acquisition to establish an eddy current (phase) steady state as indicated at process block 252. The total time for the audible trigger and the latter sections (time between the trigger point and the start of data acquisition) is nominally 2 seconds but additional time delay can be added by the operator depending on the clinical objective of the MR study.

After a 2 to 3 second delay in process blocks 250 and 252, the pulse sequence generator 121 is set to begin image data acquisition at process block 254. As described above, a fast 3D rf phase-spoiled gradient echo sequence is employed in the preferred embodiment and is completed in a single breath-hold (e.g. 10 to 40 seconds)

The leading edge of the contrast infusion arriving in the volume of interest is not the optimum moment for collecting the center of k-space because all of the arteries in the imaging volume have not yet filled out. The peak arterial contrast occurs in the middle of the bolus, not at the leading edge. Typically it may take up to 5–15 seconds for all of the arteries within the imaging volume to fill with contrast and to approach the peak of the bolus. Thus, it is preferred that the central k-space data is collected 5 to 15 seconds after detecting arrival of the contrast in the volume of interest. For patients with extremely slow flow (i.e. patients with aortic aneurysm, congestive heart failure or advanced age), it may be necessary to delay even longer. But for patients with fast flow in regions where precise arterial phase timing is more critical (i.e. carotid arteries), it may be useful to have a shorter delay.

The image data acquisition consists of a centric phase encode order as the outer loop and a sequentially ordered inner slice encode loop. The centrically ordered phase encode loop is offset by 12 views, however, such that the time delay to the center of k-space acquisition from the trigger point is given by:

Time to center of k-space=acq_delay+Nz * TR * 12 ms where acq_delay is the delay from the trigger point to the start of data acquisition, Nz is the number of slices in the 3D volume, and TR is the sequence repetition time. For a TR of 7 ms and 32 slice partitions, the delay from the start to the center of k-space is about 4.7 sec.

A second embodiment of the image data acquisition strategy is to use a centric phase encode order as the outer loop and a sequentially ordered inner slice encode loop but with 0 offset. The extra delay time is taken up by playing out the imaging sequence with repeated iterations of the slice encode loop until the desired delay time is attained. Note that the slice encode loops prior to data acquisition serves to establish an eddy current (phase) steady state and is suspended once the desired delay time (measured from the trigger point) is attained.

It may also be useful to use a shifted sequential acquisition. In this embodiment, the phase encoding steps can begin with a step which allows the center of k-space to occur at a specific moment following the trigger point. One could also have a partial k-space acquisition with less than the full 128 phase encoding steps.

What is claimed is:

1. A method for producing an image with NMR data acquired from a region of interest in a patient placed in an MRI system, the steps comprising:

a) injecting a contrast agent into the patient;

b) producing a monitor signal by repeatedly acquiring NMR data from a monitor region in the patient using a monitor pulse sequence in the MRI system;

c) detecting the flow of contrast agent into the region of interest by monitoring the value of the monitor signal;

d) acquiring NMR image data from the region of interest using a series of image pulse sequences in the MRI system when the flow of contrast agent into the region of interest is detected; and e) reconstructing an image using the acquired NMR image data.

2. The method as recited in claim 1 in which step d) is performed after the monitor signal exceeds a specified threshold value.

3. The method as recited in claim 1 which includes signaling the patient prior to performing step d) to enable the patient to begin a breath-hold prior to the acquisition of NMR image data.

4. The method as recited in claim 3 in which the patient is signaled when the monitor signal exceeds a specified threshold value.

5. The method as recited in claim 1 in which the monitor pulse sequence employs one magnetic field gradient to select a first slab of spins for excitation by an RF pulse, and it employs a second read out magnetic field gradient during the acquisition of the NMR data.

6. The method as recited in claim 5 in which a third magnetic field gradient is employed in the monitor pulse sequence to select a second slab of spins which intersects the first slab of spins.

7. The method as recited in claim 6 in which a third magnetic field gradient is employed in the monitor pulse sequence to select a second slab of spins which intersects the first slab of spins.

8. The method as recited in claim 1 in which the image pulse sequence is a 3DFT pulse sequence and the NMR image data depicts a three-dimensional volume in the region of interest.

9. The method as recited in claim 1 in which the value of the monitor signal is determined by averaging a plurality of NMR data acquisitions from the monitor region.

10. The method as recited in claim 1 in which the value of the monitor signal is determined by integrating an NMR signal acquired by the monitor pulse sequence.

11. The method as recited in claim 1 in which the monitor region is within the region of interest from which the NMR image data is acquired.

12. The method as recited in claim 1 in which at least a portion of the monitor region is outside the region of interest from which the NMR image data is acquired.

13. The method as recited in claim 1 in which step c) is performed by:

measuring a baseline value of the monitor signal by acquiring NMR data from the monitor region prior to injecting the contrast agent using the monitor pulse sequence;

establishing a threshold value of the monitor value of the monitor signal relative to said baseline value of the monitor signal; and determining that contrast agent is flowing into the region of interest when the monitor signal value exceeds the threshold value.

14. The method as recited in claim 13 in which the baseline value of the monitor signal is measured by acquiring NMR data from the monitor region during a plurality of patient respiratory cycles.

15. The method as recited in claim 13 in which the threshold value is a preset deviation from the baseline value.

16. A method for producing an image with NMR data acquired from a region of interest in a patient placed in an MRI system, the steps comprising:

a) injecting a contrast agent into the patient;

b) producing a monitor signal by repeatedly acquiring NMR data from a monitor region in the patient using a monitor pulse sequence in the MRI system;

c) detecting the flow of contrast agent into the region of interest by monitoring the value of the monitor signal;

d) acquiring NMR image data from the region of interest using a series of image pulse sequences in the MRI system when the flow of contrast agent into the region of interest is detected;

e) reconstructing an image using the acquired NMR image data; and in which the mean value of the monitor signal is calculated and step (d) is performed after the value of the monitor signal exceeds a selected number of standard deviations from its calculated mean value.

17. The method as recited in claim 16 which includes signaling the patient prior to performing step d) to enable the patient to begin a breath-hold prior to the acquisition of NMR image data.

18. The method as recited in claim 17 in which the patient is signaled when the monitor signal exceeds a specified threshold value.

19. The method as recited in claim 16 in which the monitor pulse sequence employs one magnetic field gradient to select a first slab of spins for excitation by an RF pulse, and it employs a second read out magnetic field gradient during the acquisition of the NMR data.

20. The method as recited in claim 16 in which the image pulse sequence is a 3DFT pulse sequence and the NMR image data depicts a three-dimensional volume in the region of interest.

21. The method as recited in claim 16 in which the value of the monitor signal is determined by averaging a plurality of NMR data acquisitions from the monitor region.

22. The method as recited in claim 16 in which the value of the monitor signal is determined by integrating an NMR signal acquired by the monitor pulse sequence.

23. The method as recited in claim 16 in which the monitor region is within the region of interest from which the NMR image data is acquired.

24. The method as recited in claim 16 in which at least a portion of the monitor region is outside the region of interest from which the NMR image data is acquired.

* * * * *